United States Patent [19]

Pedron

[11] Patent Number: 5,105,376
[45] Date of Patent: Apr. 14, 1992

[54] LINEAR FEEDBACK SHIFT REGISTERS

[75] Inventor: Pierrick Pedron, Immeuble, France

[73] Assignee: VLSI Technology, Inc., San Jose, Calif.

[21] Appl. No.: 564,913

[22] Filed: Aug. 8, 1990

[51] Int. Cl.$^5$ ............................................... G06F 1/02
[52] U.S. Cl. ............................................... 364/717
[58] Field of Search ........................ 364/717; 371/21.3

[56] References Cited

U.S. PATENT DOCUMENTS

| | | | |
|---|---|---|---|
| 4,845,654 | 7/1989 | Harada | 364/717 |
| 5,031,130 | 7/1991 | Harada | 364/717 |
| 5,033,048 | 7/1991 | Pierce et al. | 364/717 |

OTHER PUBLICATIONS

McCluskey, E. J., "Built-In Self-Test Techniques", *I.E.E.E. Design & Test Of Computers*, Apr. 1985, pp. 21–28.

McCluskey, E. J., *Logical-Design Principles: With Emphasis On Testable Semicustom Circuits*, Prentice Hall, 1986, pp. 455–461.

Wang, L. T. and McCluskey, E. J., "Complete Feedback Shift Register Design for Built-In Self-Test", *I.E.E.E. 1986 Conference On Computer-Aided Design*, Nov. 1986, Santa Clara, CA, pp. 11–13.

*Primary Examiner*—David H. Malzahn
*Attorney, Agent, or Firm*—Bowles Horton

[57] ABSTRACT

A linear feedback shift register has two alternatively selectable feedback configurations enabling the shift register to produce either a pseudo-random state sequence or the reverse of that sequence. The shift register configuration may be characterized by a set of simple parameters and the register is thereby suitable for automatic synthesis.

18 Claims, 10 Drawing Sheets

LINEAR FEEDBACK SHIFT REGISTERS

FIELD OF THE INVENTION

This invention relates to shift registers and more particularly to linear feedback shift registers for the generation of pseudo-random state sequences.

BACKGROUND AND SUMMARY OF THE INVENTION

It is known to configure a shift register so that it produces a pseudo-random state sequence. Linear feedback shift registers configured thus are useful in a variety of contexts, particularly built in self test arrangement for very large scale integrated circuits. A linear feedback shift register can normally configured both as a signature analyser which will analyse the response of a logic block by compacting the outputs of the block; the content of the linear feedback shift register employed in this manner is called the signature of the block. The linear feedback shift register may also be configured as a pattern generator which will generate a pseudo-random pattern which may be used to stimulate the inputs of a logic block during a test mode. The present invention is particularly concerned with the use of a linear feedback shift register in the latter mode.

As is explained more particularly in detail hereinafter, it is known to configure the linear feedback shift register for the production of a pseudo-random pattern by the provision of a feedback connection from the last stage in the shift register to the input of the first stage and also to provide between at least one pair of adjacent stages an exclusive-OR gate which receives the output of the previous stage and the feedback signal, the output of the gate being connected to the input of the next stage.

For a variety of purposes it is desirable to be able to generate a pseudo-random sequence and also the reverse of that pseudo-random sequence. It is known to use an up/down counter to generate a state sequence. By definition such counters are reversible and it is straightforward and well known to generate a forward sequence and a reverse sequence in this manner. However, up/down counters will not produce a pseudo-random sequence and the use of an up/down counter to provide a state sequence is unnecessarily cumbersome.

It is therefore the object of the invention to provide a linear feedback shift register which is capable of generating a pseudo-random state sequence and also the reverse of that sequence.

It is a more particular object of the invention to provide a linear feedback shift register which can generate a pseudo-random state sequence and which is reversible at any stage of the sequence.

It is a further object of the invention to provide a linear feedback shift register of the foregoing type and readily capable of being automatically designed, for example as part of a very large scale integrated circuit which is designed by a process of automatic synthesis.

The basis of the present invention lies in the provision of two sets of connections which are alternatively selectable and multiplexing for the selection of one or other of the sets of connections. In some configurations, multiplexing is only employed for some of the stages of the register but in a preferred configuration multiplexing is provided for each stage in the register and with such a configuration it is feasible to provide a structure which will produce a pseudo-random sequence and also be reversible at any stage in the sequence.

The invention is applicable to both 'standard' linear feedback shift registers and 'modular' shift registers. For convenience, the invention will be generally explained with reference to 'modular' shift registers except where specifically mentioned otherwise.

Other objects and advantages will be apparent from the following description which is given by way of example with reference to the drawings.

DETAILED DESCRIPTION

Figure 1:
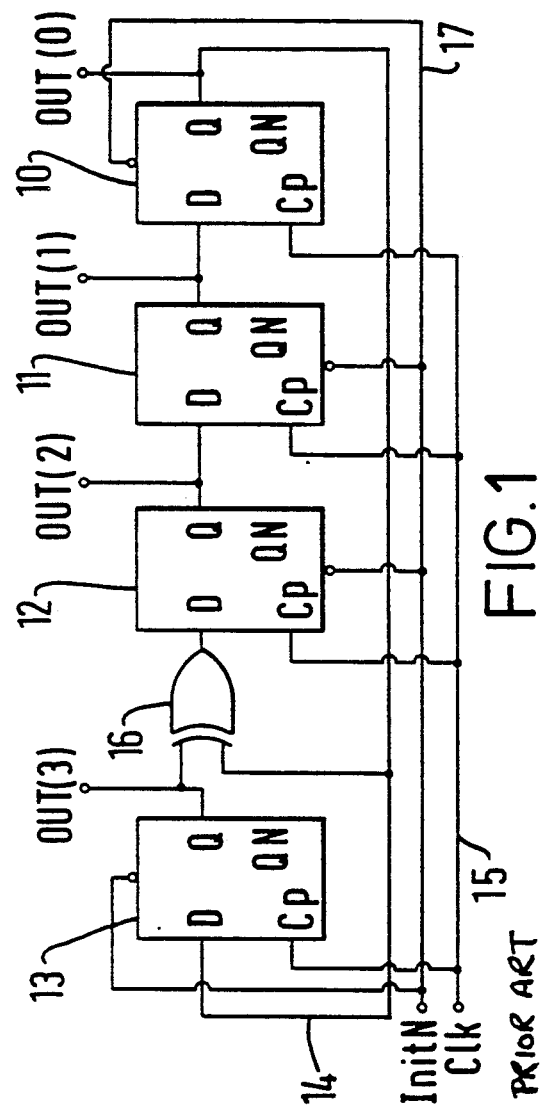
FIG. 1 is an explanatory diagram of a known form of linear feedback shift register in a modular configuration.

The present invention concerns linear feedback shift registers configured as pattern generators and capable of generating both a particular pseudo-random state sequence and the reverse of that sequence. For example, a pseudo-random state sequence which may be generated using a three stage shift register with linear feedback is as follows:

$$101 \rightarrow 100 \rightarrow 010 \rightarrow 001 \rightarrow 110 \rightarrow 011 \rightarrow 111 \rightarrow 101$$

It is accordingly intended that, in accordance with the invention, the reverse stage sequence may be generated, the reverse state sequence being as follows:

$$101 \rightarrow 111 \rightarrow 011 \rightarrow 110 \rightarrow 001 \rightarrow 010 \rightarrow 100 \rightarrow 101$$

It will be appreciated that circuits for use in or as part of very large scale integrated circuits are preferably capable of synthesis according to definite algorithms so that the circuits may be automatically synthesized as part of the synthesis of the very large scale integrated circuit. Accordingly, one aspect of the invention is to develop an algorithm for the production of a linear feedback shift register capable of generating both a forward and reverse pseudo-random state sequence.

FIG. 1 illustrates a known form of shift register which is configured as a linear feedback structure capable of generating a pseudo-random sequence. The shift register comprises four D-type clocked bistable stages (flip-flops) 10, 11, 12 and 13. The parallel outputs of the shift register constitute one state in the sequence which can be generated. The Q-output of the last stage in the register, which is regarded for convenience as the least significant bit stage, is connected by way of a line 14 to the D-input of the first stage (bistable 13). A common clock line 15 is coupled to the clock inputs of each stage. The Q-outputs of each bistable stage are connected to the D-input of the next bistable stage except for a selected pair of adjacent bistables. In the structure shown in FIG. 1 these bistable stages are the stages 12 and 13. For this pair, the Q-output of the bistable stage 13 is connected to the D-input of the bistable stage 12 by way of an exclusive-OR (XOR) gate 16. One input of the XOR gate is connected to the Q-output of the stage 13 whereas the other input of the XOR gate is connected to the feedback line. It may easily be demonstrated that such a structure, wherein the output of the last stage is connected to the input of the first stage and is also connected by way of a combining gate such as a half adder together with the output of a selected stage to the input of the next succeeding stage, will always produce a pseudo-random state sequence.

The use of an exclusive-OR gate as the combining gate for the feedback signal is normal but not essential. The significance of the exclusive-OR gate is that it has a symmetrical truth table and therefore (as is well known) excludes an output for two of the four possible sets of input signals. However, it is possible, though not preferred, to employ a gate system of which the truth table elements are complementary to those of an exclusive-OR gate, namely a gate system which provides, for example, a high output if and only if the inputs are equal (i.e. both high or both low). The term "symmetrical exclusive gate" includes both an exclusive-OR gate and a gate system as just described.

For convenience, however, the invention will be particularly described with reference to the use of exclusive-OR gates.

Figure 2:
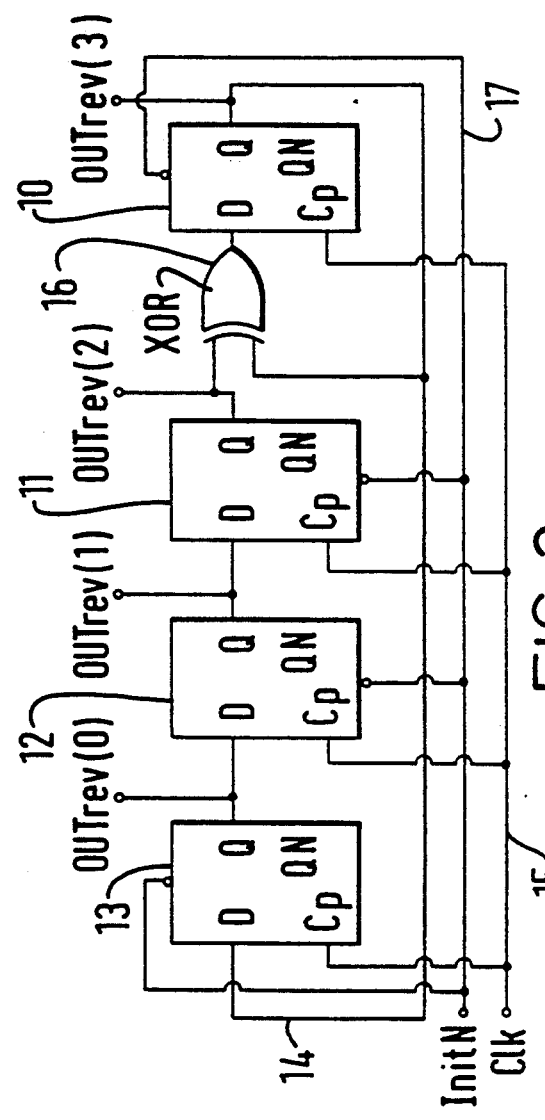
FIG. 2 is an explanatory diagram of a shift register which is configured to generate a state sequence which is reversed with respect to the state sequence which can be generated by the structure of FIG. 1.

In the registers shown in FIGS. 1 and 2, the 'all-zeros' state is prevented from occurring initially by means of an initializing line 17.

FIG. 2 is similar to the circuit shown in FIG. 1 except that the exclusive-OR gate 16 is now shifted to a position between the stages 10 and 11 and the significance of the bit outputs from the bistable stages is reversed as compared with the significance of the outputs in the configuration shown in FIG. 1. It may, again, be readily demonstrated that the sequence produced by the shift register configuration shown in FIG. 2 is the reverse of the sequence produced by the configuration shown in FIG. 1.

Figure 3:
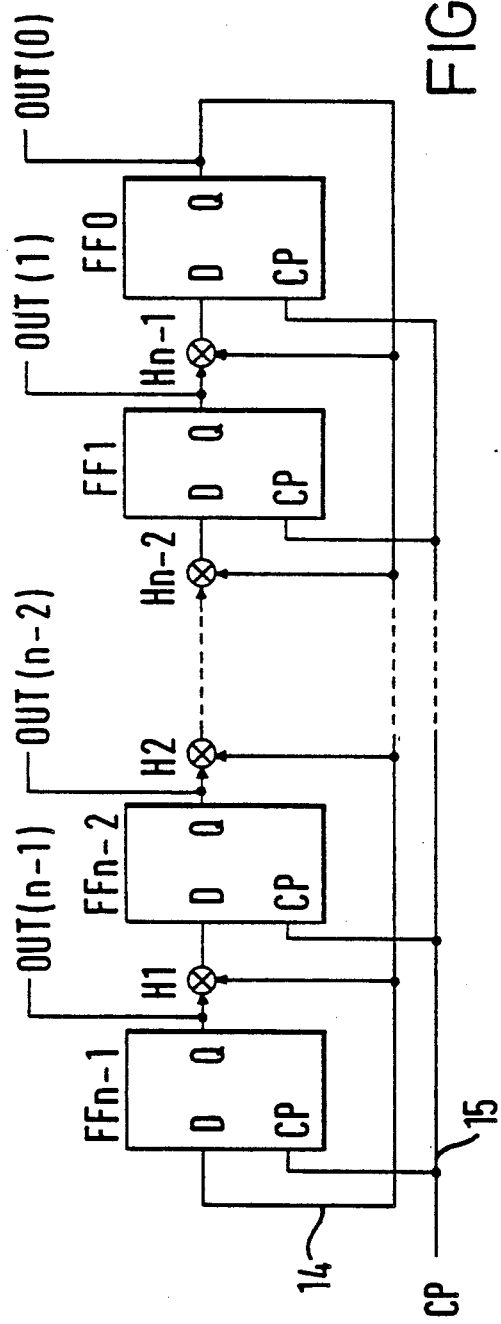
FIG. 3 is an explanatory diagram of the structure of a linear feedback shift register.

FIG. 3 illustrates a general schematic of a linear feedback shift register wherein each adjacent pair of bistable stages is connected by way of an exclusive-OR gate, shown as a circumscribed X in the diagram, having an input from the preceding bistable stage and an input from the feedback line and an output coupled to the input of the next bistable stage.

Such a network may be characterised by a set of H-parameters wherein an exclusive-OR gate is disposed at a node H1, H2 etc., only if the respective parameter Hj is equal to unity, where j has the value from 1 to (n−1).

For each size of a linear feedback shift register, there is always a feedback configuration, characterised by a set of Hj parameters that will create a pseudo-random sequence. This means that the circuit will generate a mathematically pseudo-random sequence of values on any output OUT[j]. The output values of the N-bit linear feedback shift register will cycle through $(2^n)-1$ of the $2^n$ possible values without generating twice the same value before repeating the same sequence.

For a given set of Hj parameters, the circuit that will generate the same pattern sequence in the opposite direction may be described with the following set of Rj parameters:

$$R_j = H(n-j)$$

$$1 \leq j \leq n-1$$

The outputs OUT[i] have to be crossed to provide the correct patterns. This means that if OUTrev is the output signal of the modified linear feedback shift register we will have:

$$OUTrev[j] = OUT[n-j]$$

$$0 \leq j \leq n-1$$

It is accordingly possible to devise a circuit that can generate both forward and reverse pseudo-random state sequence. In order to select between the two sequences, the present invention envisages the use of multiplexing to permit a change in the feedback connection according to the chosen direction of the sequence. Such multiplexing can operate according to a signal denoted 'DIRECTION' to select the direction of the pattern generation. When therefore the signal 'DIRECTION' is low, the linear feedback shift register may be configured as a regular state sequence generator and when the 'DIRECTION' signal is high, the shift register is configured to produce the reverse state sequence.

According to the algorithm for which the linear feedback shift register is used, two configurations exist. A first is where the reverse state sequence will be generated after the regular sequence has cycled through all different states and returned to the intial state. Such a configuration is described with reference to FIGS. 4 to 9. A second configuration is capable of reversing the state sequence at any stage. Circuits according to this configuration will be described with reference to FIGS. 10 and 11.

Reference should now be made to FIGS. 4, 5, 6 and 7 which show a respective one of four possible configurations between adjacent bistable stages according to the value of the Hj and Rj parameters.

Figure 4:
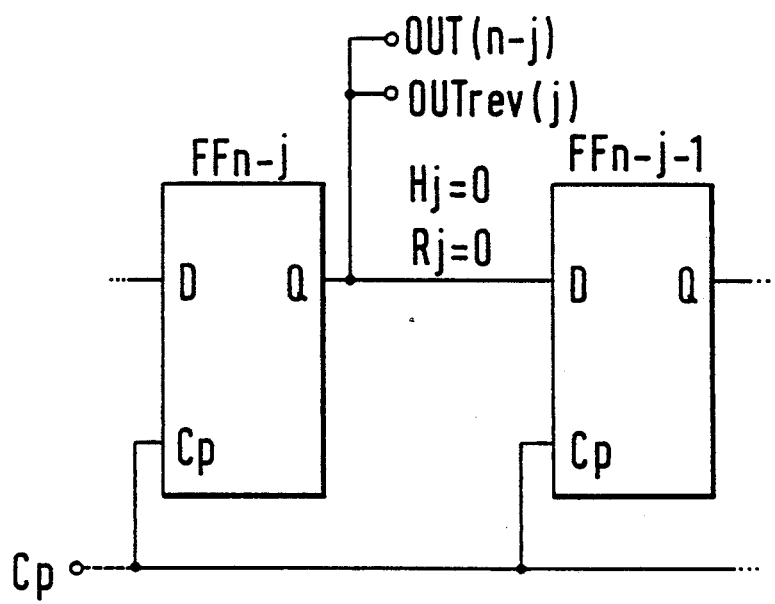

FIG. 4 illustrates the configuration where Hj and Rj are both equal to zero, the significance of which is that no feedback is applied either in the forward sequence or the reverse sequence. In the configuration shown in FIG. 4, the Q-output of the flip-flop FF(n-j) is connected directly to the next flip-flop FF(n-j-1).

Figure 5:
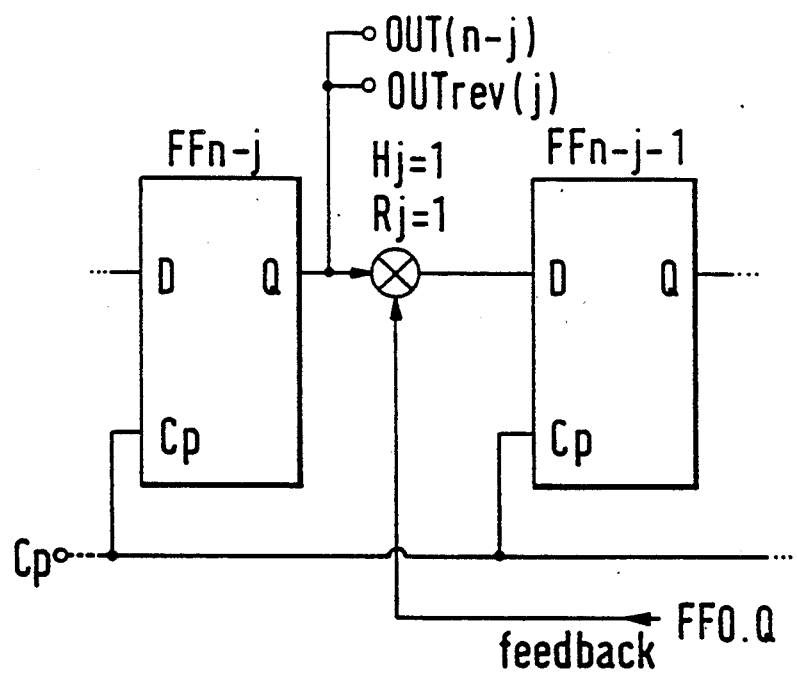

FIG. 5 illustrates the configuration wherein Hj and Rj are both equal to unity, that is to say where feedback is required for both forward and reverse configurations of the linear feedback shift register. In this arrangement, feedback from the least significant flip-flop FF(0) is applied to one input of an exclusive-OR gate which has as its other input the Q-output of the preceding flip-flop FF(n-j) and an output coupled to the D-input of the succeeding flip-flop FF(n-1-1).

Figure 6:
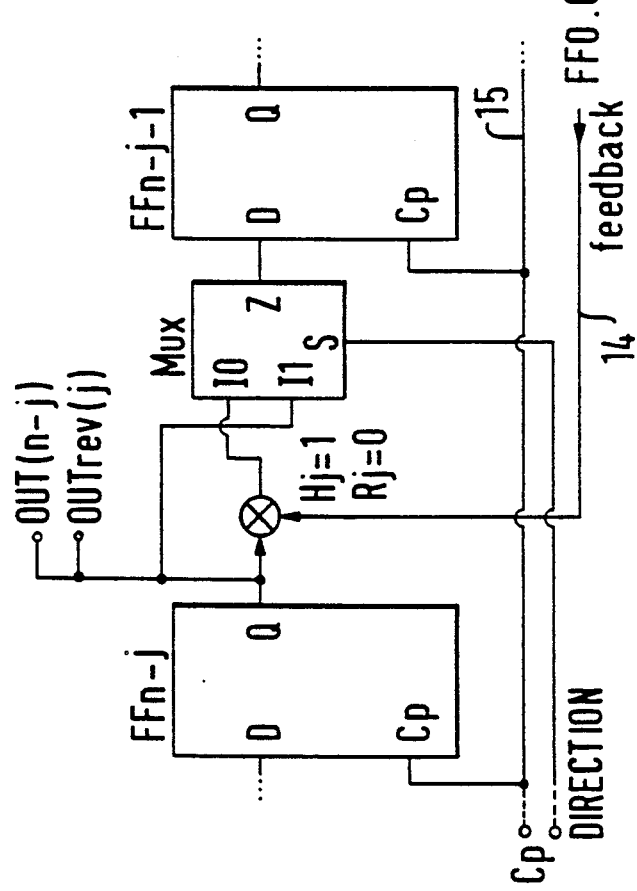
FIGS. 4, 5, 6 and 7 are explanatory diagrams of the possible connections between stages of a shift register according to one embodiment of the invention and in a modular configuration.

FIG. 6 illustrates the configuration between adjacent stages when the parameter Hj is equal to unity and the parameter Rj is equal to zero. This means that feedback is required only for the forward sequence. In this configuration, there is, as in FIG. 5, an exclusive-OR gate coupled to the feedback line and to the Q-output of the preceding stage. The output of the exclusive-OR gate is connected to the upper input 10 of a multiplexer of which the lower input I1 is connected directly to the Q-output of the preceding flip-flop FF(n-j). The output Z of the multiplexer is connected to the D-input of the next bistable FF(n-j-1) and the select input of the multiplexer is connected to the 'reverse' line.

Figure 7:
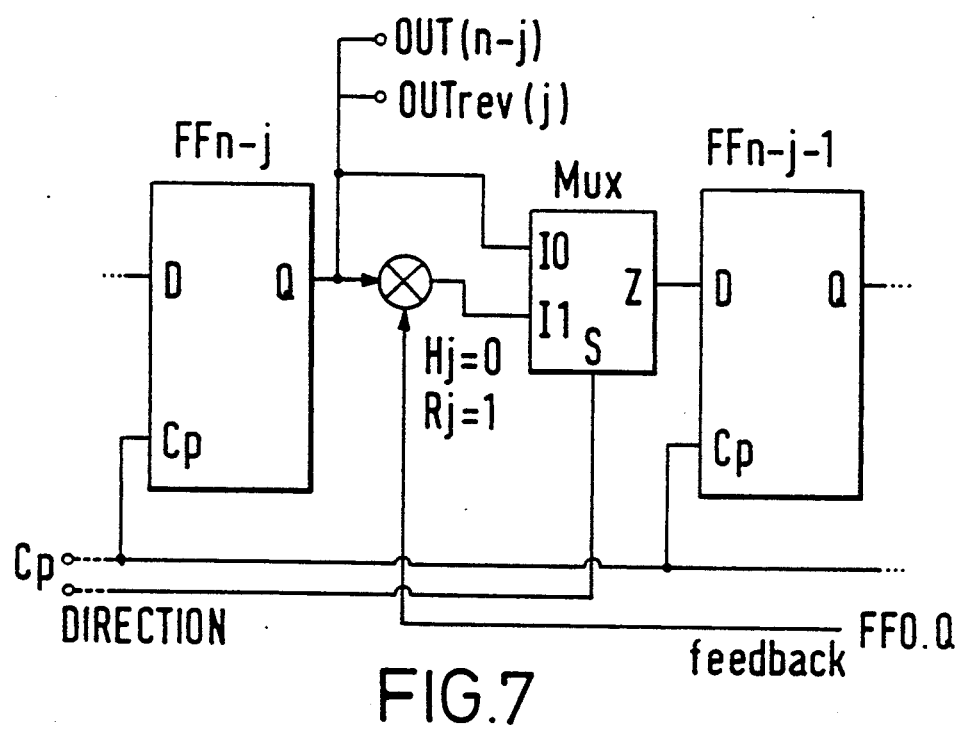

Finally, the fourth configuration is shown in FIG. 7. This is the converse of the arrangement shown in FIG. 6 and, as may readily be seen, differs from it only in that the exclusive-OR gate has its output connected to the lower input of the multiplexer whereas the Q-output of the preceding flip-flop is connected to the upper input of the multiplexer.

Figure 8:
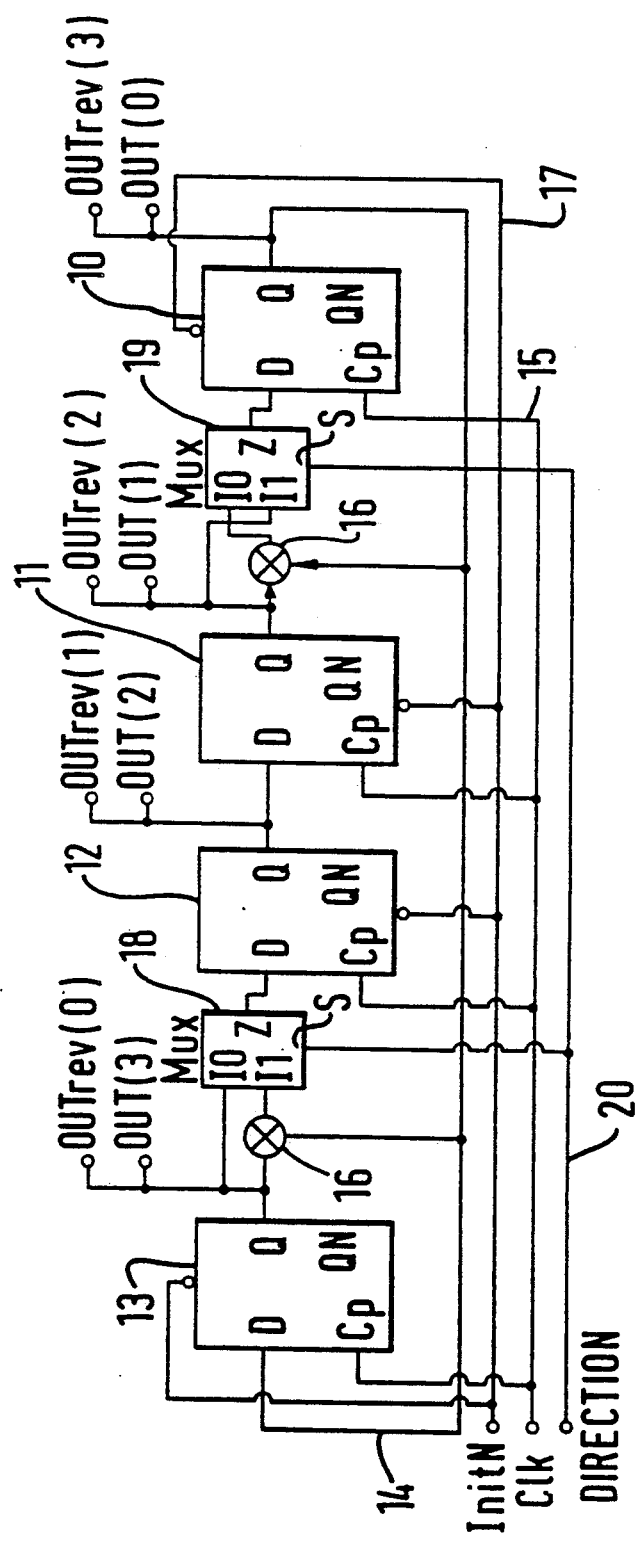
FIG. 8 is a circuit diagram illustrating one embodiment of a linear feedback shift register according to the invention and in a modular configuration.

FIG. 8 illustrates a four stage linear feedback shift register which can generate both a forward and reverse sequence and is arranged according to the scheme described with reference to FIGS. 4 to 7. In this shift register, there is a respective exclusive-OR gate 16 and multiplexer 18 connected according to FIG. 7 between gates 13 and 12 and an exclusive-OR gate 16 and multiplexer 19 connected according to FIG. 6 between the bistable stages 11 and 10. The forward or reverse pseudo-random state sequence is selected according to the state of the 'DIRECTION' signal on line 20 connected to the select inputs of the multiplexers.

Figure 9:
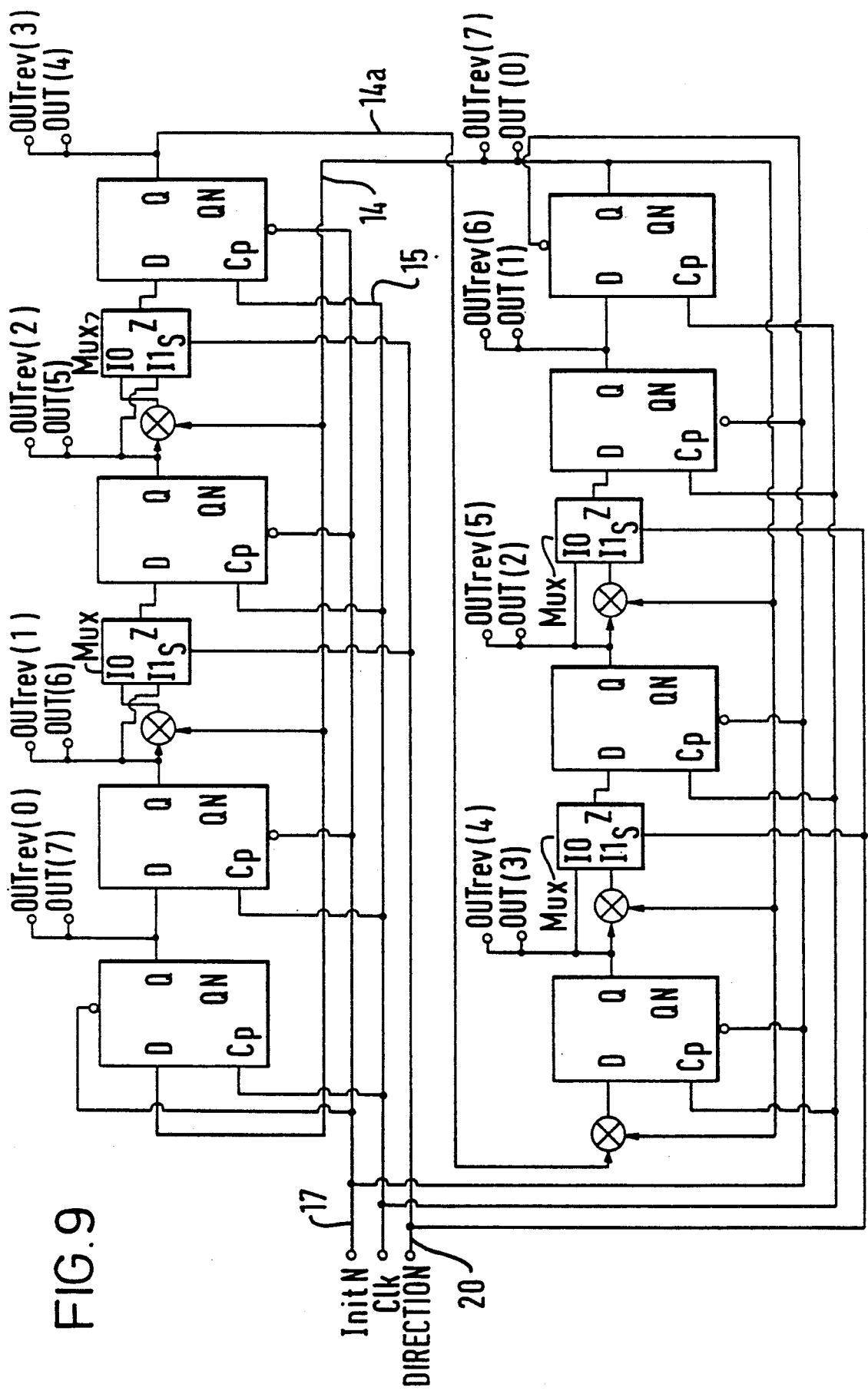
FIG. 9 is a circuit diagram of another linear feedback shift register according to a further embodiment of the invention and in a modular configuration.

FIG. 9 shows for the sake of another example a further, eight stage linear feedback shift register. Multiplexers according to FIG. 6 are connected between the second and third stages and between the third and fourth stages, an XOR gate, without multiplexer, is connected between the fourth and fifth stages, an XOR gate with multiplexer connected according to FIG. 7 is provided between each of the fifth and sixth stages and the sixth and seventh stages. No exclusive-OR gate is connected between the first and second stages or between the seventh and eighth stages. The binary weighting of the outputs is reversed as between the forward and reverse state sequences, which are selected by means of the direction line as before.

The configurations shown in FIGS. 8 and 9 have certain limitations. First, if the sequence generation is reversed before the end of the sequence (i.e. at a state which is not the initial state), then the next state will not always be the preceding state. When the sequence is reversed at the end of the sequence, then the next state will be the preceding state. Second, the initial state must be symmetrical as far as the most significant bit and the least significant bit of the state is concerned. Thus if $A0[n-1:0]$ is the initial state, then we must have:

$$A0[n-1-j] = A0[j]$$

$$0 \leq j \leq n-1$$

This limitation is a consequence of the definition of the most significant bit of the reversed output as the least significant bit of the forward output. Thirdly, owing to the reversal of the binary weighting as mentioned above two output terminals are required for each bit.

However, the configurations shown in FIGS. 8 and 9 are of considerable utility when these limitations are not important.

In the registers shown in FIGS. 8 and 9, the multiplexers are shown separately from the bistables that they respectively govern. As will be seen with reference to FIGS. 10 and 11, the multiplexers may be made integral with the respective bistable circuits.

In the configuration shown in FIGS. 1 to 9 there is a reversal of the binary weighting between the sequences, the MSB of one sequence being the LSB of the reverse sequence. This may be avoided by the provision of two feedback configurations, in which the stages of the shift register are connected in opposite senses.

Figure 10:
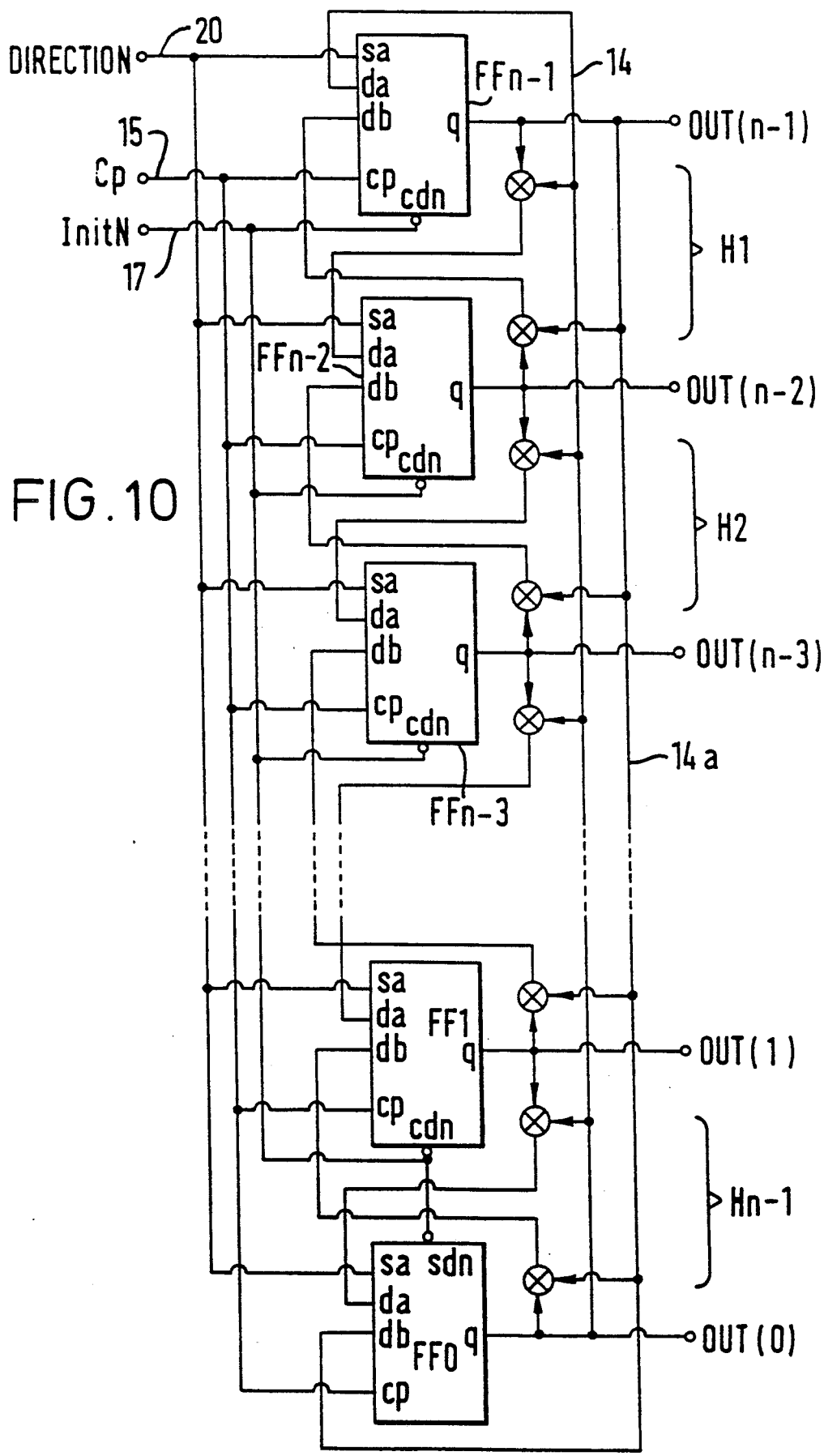
FIG. 10 is a schematic diagram of a 'modular' linear feedback shift register capable of being reversed at any state of the sequence.

This implementation is shown in FIG. 10. It will be seen in this figure that there are two feedback lines 14 and 14a, the first extending from the Q output of the stage FF0 and the other, extending in the reverse sense, from the Q-output of the stage of FF(n-1). In one configuration the stages are connected in a chain in one direction; in the other configuration the bistable stages are connected in the reverse direction. For each adjacent pair of the flip-flops the configuration takes one of two forms, according to the value of the respective H parameter and therefore only the possible connections for the stages FFn-1 and FFn-2 need be described. If the respective parameter (H1) is zero, the Q-output of the stages FFn-1 is connected directly to the upper multiplexed input da of stage FFn-2 and the Q-output of the stage FFn-2 is connected directly to the lower multiplexed input db of the flip-flop FFn-1. If the H-parameter is unity, then the Q-output of the stage FFn-1 and the feedback line 14 are coupled to the upper multiplexed input of the stage FFn-2 by way of a combining gate, preferably an exclusive OR gate, denoted by circumscribed X as before. Moreover, the Q-output of stage FFn-2 and the feedback line 14a are coupled to the lower multiplexed input db of the stage FFn-1 by way of the combining gate.

The register may have any number of stages and is completely specified by the set of H parameters H1 to Hn-1 where n is the number of stages. At least one H-parameter must be unity, and for each value of n, the number of stages, there exists at least one set of H parameters which create a pseudo-random sequence, which can start at any of the possible states (as selected by the Init N line) and reversed at any state by a change in state of the signal on the DIRECTION line, which selects either the upper inputs da of the flip-flops or the lower inputs db of the flip-flops.

Figure 11:
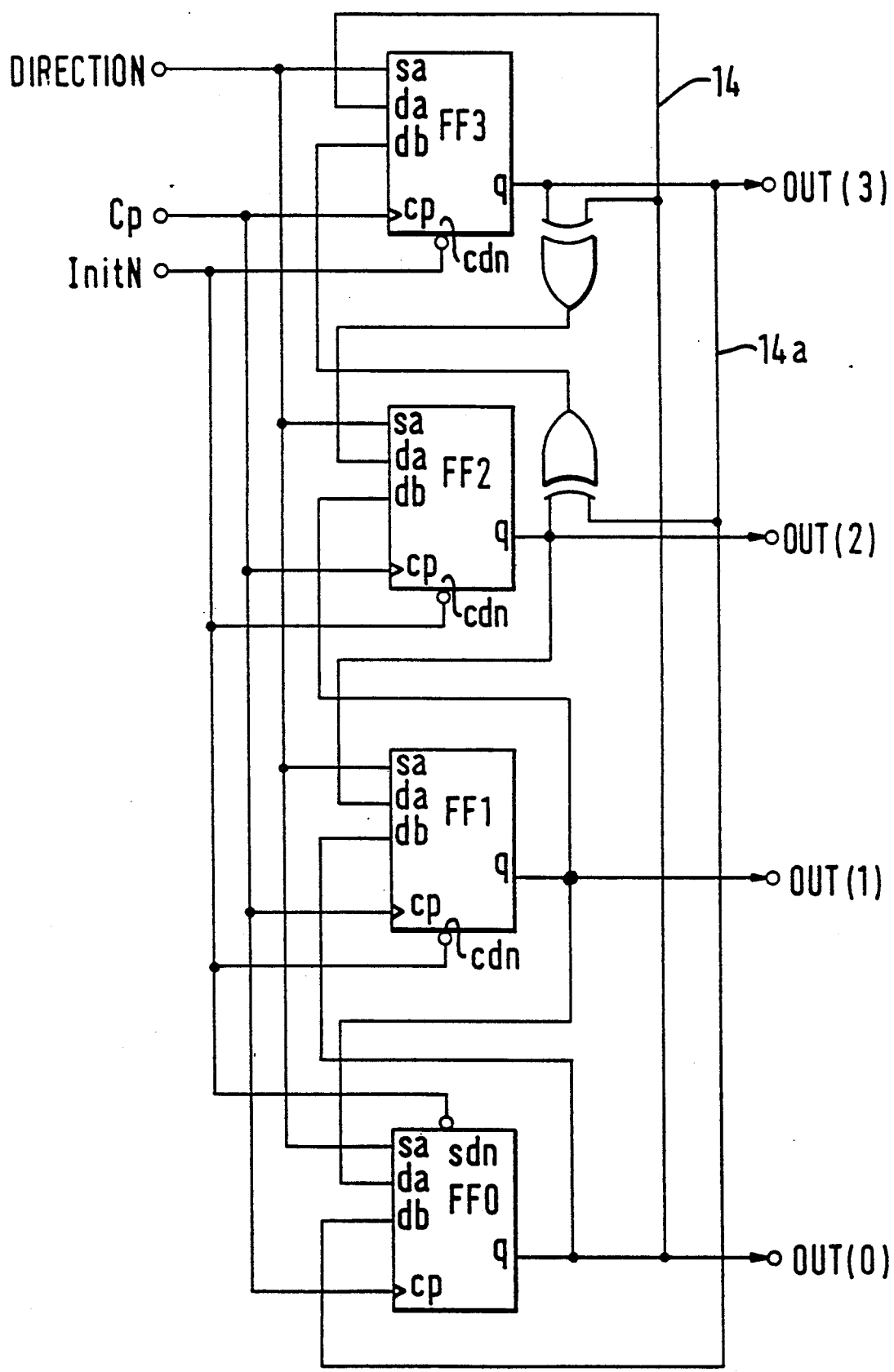
FIG. 11 is a circuit diagram of a 'modular' four stage linear feedback shift register according to the invention and reversible at any state of the sequence.

FIG. 11 illustrates a specific example of a four stage register, arranged according to the scheme of FIG. 10 and having H parameters, H1 equal to unity and H2, H3 equal to zero. Accordingly the register has a single pair of exclusive-OR gates coupling the stages FF3 and FF2 in the manner described above.

Because the structure is defined completely by the H parameters or H and R parameters for the registers of FIGS. 4 to 9, the layout of the linear feedback shift registers may be achieved as part of a process of automatic synthesis of an integrated circuit. The relevant program segment will define the number of bistables, the feedback line or lines and the external connections (i.e. the clock), initializing and direction lines and will define the presence or absence of the exclusive-OR gates and the multiplexing configurations in accordance with the values of the H or H and R parameters.

The examples of linear feedback shift registers in FIGS. 1 to 11 are modular shift registers, in which the exclusive-OR gates (or equivalents thereof) are each disposed in a respective forward transmission path along the chain of bistable stages. Thus, for example, in FIG. 8 each XOR gate has one input coupled to the output of a preceding stage (such as stage 13), its output coupled to one of the selectable inputs of the succeeding stage, such as stage 12 and a second input connected to the feedback line such as line 14. The invention is applicable to so-called standard linear feedback shift registers in which the XOR gates are each part of the respective feedback path instead of a forward transmission path.

Figure 12:
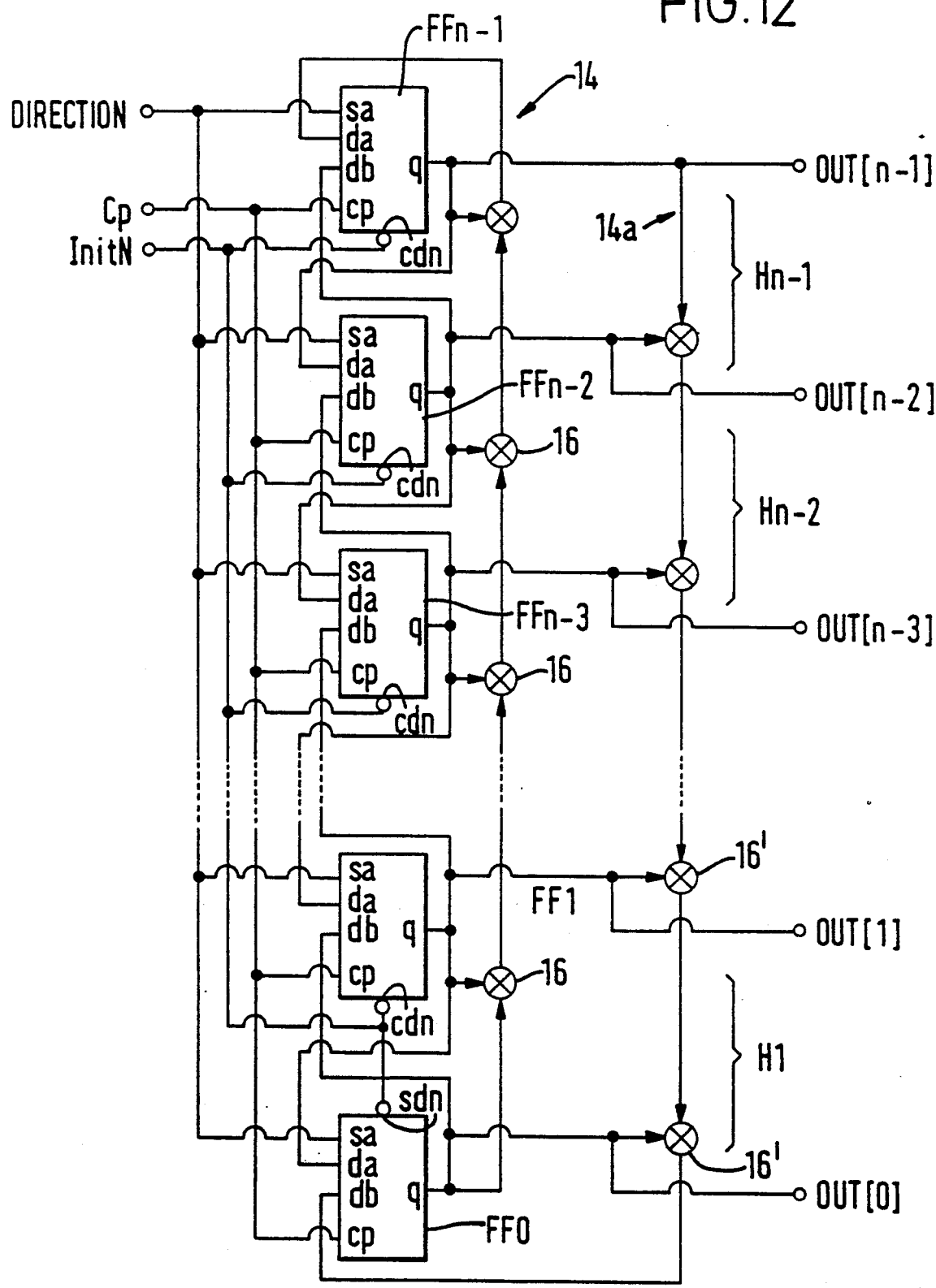
FIG. 12 is a schematic diagram of a general linear feedback shift register according to the invention and in a 'standard' configuration.

The general circuit is shown in FIG. 12, which illustrates a linear feedback register having an arbitrary number (n) of bistable stages FFn-1 to FF0. Each stage has data, clock and control inputs and outputs like the stages shown in FIG. 10. All the first inputs (da) of the stages may be enabled or all the second inputs (db) may be enabled according to the state of the DIRECTION signal. In the circuit of FIG. 12, there is a first forward transmission path from the first bistable stage FFn-1 to the last stage FF0, this path comprising the connection from the q output of the first stage to the da input of the second stage and so on. A second forward transmission path extends from the last stage FF0 to the first stage, this path comprising the connection from the q output of the last stage to the second input db of the next stage and so on to the first stage. The multiplexing means comprising the direction line and the select inputs accordingly can enable either the first forward transmission path or the second forward transmission path. The circuit has two selectable feedback paths. A first extends from the q output of the last stage FF0 to the first input da of the first stage FFn-1 whereas a second extends from the q output of the first stage FFn-1 to the second input of the last stage FF0.

FIG. 12 is a diagram like FIG. 10, in that it illustrates all the possible locations for the XOR gates rather than a particular embodiment, which may be specified as a set of H parameters as before. Each XOR gate, if present, is disposed in a feedback path, having one input and an output, by way of which the respective feedback path extends from the first to the last stage or vice versa, and a second input connected to the output of a respective stage.

The H-parameters H(n-1) to H1 denote whether a respective pair of gates, one in each feedback path, is present. As before, at least one H parameter must be non-zero, so that there is at least one XOR gate in each feedback path, and there exists for a shift register of any arbitrary length at least one set of H parameters which will provide a pseudo-random sequence which is reversible at any stage in the sequence. In this form of the invention each H parameter can be used to denote whether respective adjacent stages have their outputs combined by a respective XOR gate with the respective feedback signal.

Figure 13:
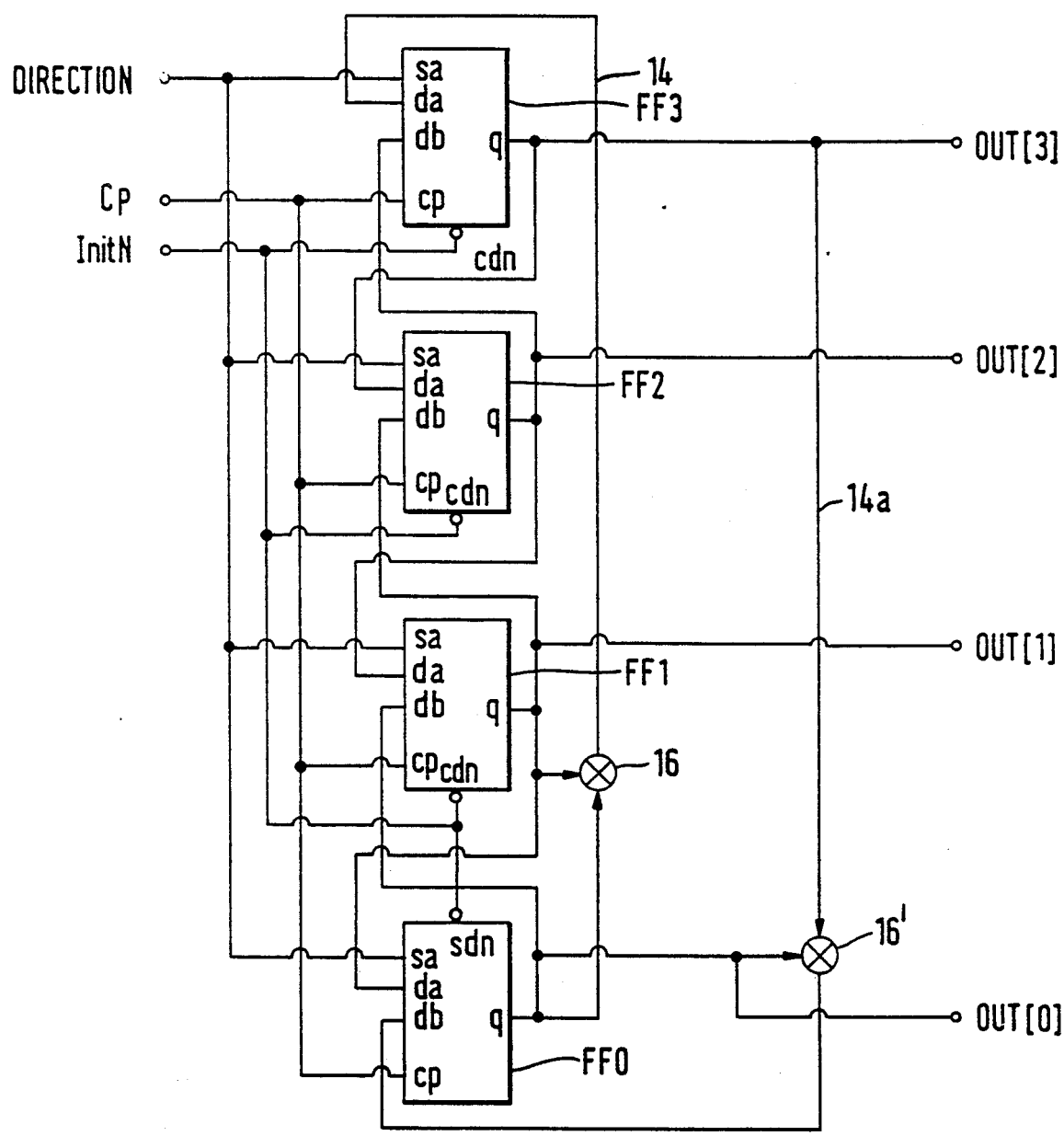
FIG. 13 is a circuit diagram of a specific four stage linear feedback shift register according to the invention and in a 'standard' configuration.

FIG. 13 illustrates one specific embodiment of a four-stage standard linear feedback shift register according to the invention. For this register H1 is unity and H2=H3=0, so that there is only one XOR gate for each feedback path, one XOR gate 16 forming a sum of the output of stage FF1 with the output of the last stage FF0, the output of XOR gate 16 being coupled to the first input da of the first stage, and one XOR gate 16' forming a sum of the output of stage FF0 with the output of stage FF3, the output of gate 16' being coupled to the second input db of the last stage FF0. The register is reversible at any stage of the sequence by changing the state of the DIRECTION signal, which as previously noted enables either the first inputs of all the stages or the second inputs of all the stages and thereby enables a selected one of the forward transmission paths and its corresponding feedback path.

Various modifications will readily occur to those skilled in the art within the spirit and scope of the claims that follow.

I claim:
1. A linear feedback shift register comprising:
a plurality of bistable stages;
means for providing two selectable feedback configurations each including the bistable stages and each providing one of a pair of forward and reverse pseudo-random state sequences; and
means, coupled to the said means for providing, for selecting one of said sequences.

2. A linear feedback shift register comprising:
a multiplicity of bistable stages;
first means for providing a first connection of the stages and at least a first feedback combining means in a first linear feedback shift register configuration, such configuration being operable to generate a first pseudo-random state sequence;
second means for providing a second connection of the stages and at least a second feedback combining means in a second linear feedback shift register configuration, said second configuration being operable to generate a second pseudo-random state sequence which is the reverse of the first pseudo-random state sequence; and
said first and second means including multiplexer means for selecting said first and second connections.

3. A linear feedback shift register as set forth in claim 2 wherein the first and second means each provide a respective input to at least one of the bistable stages and the multiplexer means comprise means for selecting for said at least two stages the respective input to complete the first configuration or the second configuration respectively.

4. A shift register as set forth in claim 3 wherein said multiplexer means are integral with the bistables stages.

5. A linear feedback shift register as set forth in claim 3 wherein said combining means each comprise an exclusive-OR gate for combining an output of a respective stage with a feedback signal and for coupling a sum output to a stage other than said respective stage.

6. A linear feedback shift register as set forth in claim 3 in which said combining means comprise a first feedback path including at least one exclusive-OR gate having an input coupled to an output of a respective bistable stage and a second feedback path including at least one exclusive-OR gate having an input coupled to an output of a respective bistable stage, and said multiplexer means includes means for enabling selectively one or other of said feedback paths and a respective one of two forward transmission paths along said bistable stages in opposite directions.

7. In a linear feedback shift register having a multiplicity of bistable stages including a most significant stage and a least significant stage and at least one intermediate stage whereby the shift register includes a plurality of pairs of adjacent stages; at least one feedback line extending from one of the said most and least significant stages to the other of the said most and least significant stages, the combination comprising:

a first and a second bistable stage constituting one of the adjacent pairs of stages, the first stage having an output means and the second stage having first and second input means and multiplexer means for selecting one of said first and second input means for the reception of an input signal;

means for connecting the output means of said first stage to said first means; and gating means having an input connected to said output means, a second input connected to said feedback line and an output coupled to said second input means.

8. The combination set forth in claim 7 wherein the gating means comprises an exclusive-OR gate.

9. The combination set forth in claim 7 further comprising:

a third and a fourth bistable stage constituting another of the adjacent pairs of stages, the third stage having an output means and the fourth stage having first and second input means and multiplexer means for selecting one of said first and second input means of said fourth stage for the reception of an input signal;

means for connecting the output means of said third stage to said second input means of said fourth stage; and gating means having an input connected to said output means, a second input connected to said feedback line and an output coupled to said first input means.

10. In a linear feedback shift register having a multiplicity of bistable stages including a most significant stage and a least significant stage and at least one intermediate stage whereby the shift register includes a plurality of pairs of adjacent stages, the combination comprising:

a first feedback line extending from the said most to the said least significant stages and a second feedback line extending from the said least to the said most significant stages; and, in respect of at least one of said pairs of stages:

a first exclusive-OR gate having inputs coupled to the first feedback line and an output of a first stage of the pair, and an output connected to a first input of a second stage of the pair;

a second exclusive-OR gate having inputs coupled to the second feedback line and an output of the second stage, and an output connected to a first input of the first stage, each of the first and second stages having a second input coupled to other stages; and multiplexer means for enabling one or other of said first inputs of each of said first and second stages.

11. A linear feedback shift register comprising:

a multiplicity of bistable stages, each stage having a respective first and second input means, an output means and multiplexer means for selecting one or other of said first and second input means for the reception of an input signal, the said multiplicity of stages including a first stage, a last stage and at least one intermediate stage whereby there is a plurality of pairs of mutually adjacent stages;

a first feedback line extending from the output means of the said last stage to a first input means of the said first stage;

a second feedback line extending from the output means of the said first stage to the said second input means of the said last stage;

and, in respect of at least a selected one of the pairs of adjacent stages:

a first symmetrical exclusive gating means having gate inputs coupled to the output means of a first stage of the pair and to the first feedback line and a gate output coupled to the first input means of the said first stage; a second symmetrical exclusive gating means having gate inputs coupled to the output means of the second stage of the pair of stages and to the second feedback line and a gate output coupled to the second input means of the said first stage of the pair; and selector means for enabling either the said first input means or the said second input means of the stages.

12. A linear feedback shift register as set forth in claim 11 wherein for each pair of stages other than a said selected pair, an output of a first stage in the pair is coupled to the second input means of the second stage in the pair and an output of the second stage in the pair is connected to the first input means of the first stage in the pair.

13. A linear feedback shift register as set forth in claim 12 wherein the multiplexer means for each stage is integral with the respective stage.

14. A linear feedback shift register as set forth in claim 12 wherein each symmetrical exclusive gating means is an exclusive-OR gate.

15. A linear feedback shift register comprising:

a multiplicity of bistable stages including a first stage, a last stage and at least one intermediate stage, each stage having first and second input means and an output;

multiplexer means for selectively enabling all the first input means of the bistable stages or all the second input means of the bistable stages;

a first forward transmission path from the said first stage to the said last stage and comprising connecting means from the output of each stage to the first input means of the next stage;

a second forward transmission path from the said last stage to the said first stage and comprising connecting means from the output of each stage to the second input means of the next stage;

a first feedback path from the output of the said last stage to the said first input means of the said first stage, said feedback path including at least one symmetrical exclusive gating means having a first input in the said first feedback path and a second input coupled to the output of a respective bistable stage; and a second feedback path from the output of the said first stage to the second input means of the said last stage, said second feedback path including at least one symmetrical exclusive gating means having a first input in the said second feedback path and a second input coupled to the output of a respective bistable stage.

16. A shift register as set forth in claim 15 wherein each symmetrical exclusive gating means comprises an exclusive-OR gate.

17. A shift register as set forth in claim 15 wherein the multiplexer means are integral with the bistable stages.

18. A shift register as set forth in claim 15 wherein the said respective stages are adjacent stages.

* * * * *